(12) United States Patent
Varghese

(10) Patent No.: US 10,312,429 B2
(45) Date of Patent: Jun. 4, 2019

(54) MAGNETOELECTRIC MACRO FIBER COMPOSITE FABRICATED USING LOW TEMPERATURE TRANSIENT LIQUID PHASE BONDING

(71) Applicant: EYOB LLC, Palm Harbor, FL (US)

(72) Inventor: Ron Varghese, Palm Harbor, FL (US)

(73) Assignee: EYOB LLC, Palm Harbor, FL (US)

(*) Notice: Subject to any disclaimer, the term of this patent is extended or adjusted under 35 U.S.C. 154(b) by 399 days.

(21) Appl. No.: 15/222,070

(22) Filed: Jul. 28, 2016

(65) Prior Publication Data
US 2018/0033947 A1   Feb. 1, 2018

(51) Int. Cl.
| | | |
|---|---|---|
| *B23K 31/02* | (2006.01) | |
| *H01L 41/20* | (2006.01) | |
| *B23K 1/00* | (2006.01) | |
| *G01R 33/18* | (2006.01) | |
| *H01L 41/00* | (2013.01) | |
| *H01L 41/16* | (2006.01) | |
| *H01L 41/313* | (2013.01) | |
| *B23K 101/36* | (2006.01) | |

(52) U.S. Cl.
CPC ............ *H01L 41/20* (2013.01); *B23K 1/0016* (2013.01); *G01R 33/18* (2013.01); *H01L 41/00* (2013.01); *H01L 41/16* (2013.01); *H01L 41/313* (2013.01); *B23K 2101/36* (2018.08)

(58) Field of Classification Search
CPC ....... H01L 41/20; H01L 41/16; H01L 41/313; H01L 41/00; G01R 33/18; B23K 1/00–206; B23K 2101/36–42

USPC ........ 228/179.1–180.22, 245–262, 175–176
See application file for complete search history.

(56) References Cited

U.S. PATENT DOCUMENTS

| | | | | |
|---|---|---|---|---|
| 4,786,837 A | * | 11/1988 | Kalnin ................. | B06B 1/0688 310/330 |
| 5,068,865 A | * | 11/1991 | Ohshima .............. | G02B 6/4207 372/36 |
| 5,089,739 A | * | 2/1992 | Takahashi ............ | H01L 41/083 310/328 |
| 5,120,377 A | * | 6/1992 | Morohashi ........... | C04B 35/645 156/89.17 |

(Continued)

FOREIGN PATENT DOCUMENTS

| | | | | |
|---|---|---|---|---|
| JP | 2003010785 A | * | 1/2003 | |
| JP | 2008200706 A | * | 9/2008 | |
| WO | WO-2015111622 A1 | * | 7/2015 | ........... B06B 1/0611 |

OTHER PUBLICATIONS

High, James W. and Wilkie, W.Keats, Method of Fabricating NASA-Standard Macro-Fiber Composite Piezoelectric Actuators, Jun. 2003.

(Continued)

*Primary Examiner* — Kiley S Stoner
(74) *Attorney, Agent, or Firm* — Larson & Larson, P.A.; Justin P. Miller; Frank Liebenow

(57) ABSTRACT

A composite material fabricated using a novel process and materials. The piezoelectric and magnetostrictive layers of the composite material are coated, layered, and bonded using a process known as LTTLP bonding. The resulting magnetoelectric composite fibers are bonded to a polyimide film based copper flexible circuit using a room temperature curing epoxy. The sensor that results is an MEMFC that outperforms conventionally fabricated MEMFCs.

12 Claims, 6 Drawing Sheets

(56) References Cited

U.S. PATENT DOCUMENTS

| | | | | |
|---|---|---|---|---|
| 5,288,551 | A * | 2/1994 | Sato | B06B 1/0688 |
| | | | | 428/334 |
| 5,325,012 | A * | 6/1994 | Sato | H01L 41/313 |
| | | | | 228/121 |
| 5,438,232 | A * | 8/1995 | Inoue | H01L 41/083 |
| | | | | 310/328 |
| 5,440,193 | A * | 8/1995 | Barrett | B64C 13/50 |
| | | | | 156/291 |
| 6,279,406 | B1 * | 8/2001 | Li | G01R 33/02 |
| | | | | 73/861.08 |
| 6,323,059 | B1 * | 11/2001 | Yoshida | B82Y 20/00 |
| | | | | 257/678 |
| 6,333,589 | B1 * | 12/2001 | Inoi | H01L 41/053 |
| | | | | 310/351 |
| 6,334,567 | B1 * | 1/2002 | Xie | B23K 20/10 |
| | | | | 228/110.1 |
| 6,570,297 | B1 * | 5/2003 | Takeuchi | H01L 41/0946 |
| | | | | 310/328 |
| 6,577,044 | B1 * | 6/2003 | Li | H01L 41/107 |
| | | | | 310/366 |
| 6,629,341 | B2 | 10/2003 | Wilkie | |
| 6,809,516 | B1 * | 10/2004 | Li | G01R 15/20 |
| | | | | 324/244 |
| 7,197,798 | B2 | 4/2007 | Wilkie | |
| 7,380,698 | B2 * | 6/2008 | Meyer | B23K 1/0012 |
| | | | | 228/194 |
| 2002/0047217 | A1 * | 4/2002 | Zakel | B23K 35/001 |
| | | | | 257/781 |
| 2002/0190608 | A1 * | 12/2002 | Beck | B06B 1/0618 |
| | | | | 310/328 |
| 2004/0126620 | A1 * | 7/2004 | Viehland | G01R 33/02 |
| | | | | 360/328 |
| 2006/0128136 | A1 * | 6/2006 | Syllaios | B23K 1/0016 |
| | | | | 438/613 |
| 2006/0232173 | A1 * | 10/2006 | Kobane | F02M 47/027 |
| | | | | 310/366 |
| 2007/0131737 | A1 * | 6/2007 | Renavikar | B23K 1/0008 |
| | | | | 228/231 |
| 2010/0016728 | A1 * | 1/2010 | Dietz | A61B 17/320068 |
| | | | | 600/459 |
| 2010/0327431 | A1 * | 12/2010 | Touzelbaev | B23K 1/0016 |
| | | | | 257/712 |
| 2011/0067908 | A1 * | 3/2011 | Weichslberger | A47F 3/001 |
| | | | | 174/257 |
| 2013/0037603 | A1 * | 2/2013 | Choi | H01L 23/49816 |
| | | | | 228/203 |
| 2013/0106411 | A1 * | 5/2013 | Chen | G01R 33/18 |
| | | | | 324/252 |
| 2014/0062263 | A1 * | 3/2014 | Ogawa | H01L 41/0472 |
| | | | | 310/364 |
| 2014/0215784 | A1 * | 8/2014 | Lhuillier | B06B 1/0644 |
| | | | | 29/25.35 |
| 2016/0116552 | A1 * | 4/2016 | Jahns | G01R 33/0005 |
| | | | | 324/244 |
| 2016/0128769 | A1 * | 5/2016 | Rontal | A61B 18/1492 |
| | | | | 600/104 |
| 2016/0284979 | A1 * | 9/2016 | Fukui | H01L 41/0815 |
| 2017/0033764 | A1 * | 2/2017 | Inoue | H03H 9/02574 |
| 2017/0128122 | A1 * | 5/2017 | Rontal | A61B 18/1206 |
| 2017/0222118 | A1 * | 8/2017 | Tomita | H01L 41/293 |

OTHER PUBLICATIONS

NASA, Piezoelectric Fiber Composite Actuator Portfolio, NASA Technology Transfer Program Bringing NASA Technology Down to Earth.

* cited by examiner

MAGNETOELECTRIC MACRO FIBER COMPOSITE FABRICATED USING LOW TEMPERATURE TRANSIENT LIQUID PHASE BONDING

FIELD

This invention relates to the field of sensors and more particularly to a method of fabricating a magnetoelectric macro fiber composite using low temperature transient liquid phase bonding.

BACKGROUND

Electronics continue to be incorporated into more products. Applications include industrial machinery to manufacture cars and package foods, as well as consumer products that detect keystrokes or the position of motors.

In order to properly control the mechanical components of a device it is critical to be able to measure the speed and position of the mechanical elements. The electronic components that perform such measurement are referred to as sensors.

For the applications described above, what is commonly used today is known as a Hall effect sensor. A Hall effect sensor has two primary components—a magnet and a p-type semiconductor. When the Hall effect sensor is activated a constant current is passed through the semiconductor. The current passes along a first axis. Separately, a voltage is measured across a second axis, perpendicular to the first axis.

As the magnet changes position relative to the semiconductor, the measured voltage across the second axis changes. The changes in voltage are used to calculate changes in the position of the magnet, which can be in turn used to calculate distance and speed.

The primary drawback of a Hall effect sensor is its need for constant power. Removing the current deactivates the sensor.

Given that many applications for position and speed sensors include applications using battery power, consumption is a concern. Eliminating the need for constant power results in superior battery life and an improved product.

What is needed is an alternative sensor that provides the versatility of a Hall effect sensor, but without the drawback of requiring constant power.

SUMMARY

Described within is a magnetoelectric macro fiber composite ("MEMFC") fabricated using a novel process and materials.

The piezoelectric and magnetostrictive layers are coated, layered, and bonded using a process known as low temperature transient liquid phase ("LTTLP") bonding. The resulting monolithic magnetoelectric composite fibers are optionally bonded to a polyimide film based copper flexible circuit using a room temperature curing epoxy. The sensor that results is an MEMFC that outperforms conventionally fabricated MEMFCs, which have discrete components of magnetic material glued to piezoelectric fibers.

The resulting magnetoelectric macro fiber composite is primarily intended for use in AC and RF magnetic field and vibration harvesting. Commercial applications include magnetic field actuators, sensors for use on curved surfaces, and as a self-powered alternative to Hall effect motion sensors.

For clarity, a summary of important terms:
ME composite material—a magnetoelectric material formed from one or more layers of piezoelectric material and one or more layers of magnetostrictive material;
Magnetoelectric fiber—a strand or fiber of ME composite material after the ME composite material has been sliced into lengths;
Macro fiber composite—a composite of piezoelectric fibers and an interdigitated electrode layer, the electrode layer supported by a polymer/plastic; and
MEMFC—a magnetoelectric macro fiber composite, which is a composite of magnetoelectric fibers and an interdigitated electrode layer, the electrode layer supported by a polymer/plastic.

Before discussing the novel method to fabricate an MEMFC, an overview of macrofiber composites ("MFCs") is helpful.

An MFC consists of rectangular piezoelectric material rods in a plane, layered with adhesive, electrodes, and a polyimide film. The electrodes are attached to the polyimide film in a pattern referred to as an interdigitated pattern. This pattern is similar to that created by two hands in a single plane, the fingers interlocking with each other without contact.

The connection between the electrodes and the piezoelectric material allows for voltage transfer to and from the piezoelectric material. The application of voltage acts to bend or distort material, thereby counteracting vibrations, or acting to generate vibrations.

The resulting assembly is thin and able to conform to non-flat surfaces. Thus, it may be bonded to a structure or embedded within an assembly. In such roles the assembly may be passive, acting as a strain gauge to sense deformation, noise, and vibrations.

The MFC evolved over time into a more complex device—the MEMFC.

MEMFCs are the combination of a monolithic magnetostrictive material and a piezoelectric MFC, or a magnetostrictive layer to a piezoelectric laminate composite, with the addition of an electrode layer. The magnetostrictive material and a piezoelectric fibers are separated by a polymer layer. As a result of the separation the mechanical coupling is of a lower quality than a direct bond of the two materials, and the two layers are electrically isolated from one-another.

The disclosed invention solves the problem of poor coupling by combining a piezoelectric MFC and the magnetostrictive layer without the use of a polymer laminate. Rather, the piezoelectric and magnetostrictive layers are bonded using LTTLP bonding. The result is an LTTLP bonded MEMFC.

The overall structure of the disclosed device is as follows.
The base structure is a piezoelectric layer LTTLP bonded to a magnetostrictive layer. The piezoelectric layer is above the magnetostrictive layer. On top of the piezoelectric layer is a layer of copper electrodes separated and stabilized by a polyimide film.

The prototypes were created using piezoelectric layers from Piezo Systems, parts 5A4E and 5H4E. The parts were 0.127 mm thick. The Piezo Systems parts came with a nickel electrode layer, which was removed.

Alternative piezoelectric materials include $(1-x)[Pb(Mg_{1/3}Nb_{2/3})O_3]-x[PbTiO_3]$ ("PMN-PT") and other similar materials.

The magnetostrictive layer was a Type 40011 ferrite tape from Electroscience. This produces a flexible cast film of magnetic powder dispersed in an organic matrix.

Alternatives to Type 40011 ferrite tape include highly magnetostrictive material such as Terfenol-D, Metglas, $(Ni_{0.6}CU_{0.2}Zn_{0.2})Fe_2O_3$ ("NCZF"), and other similar materials.

The flexible circuit of electrodes is an interdigitated electrode ("IDE") planar pattern fabricated from Pyralux 8510 tape. The copper electrodes are 150 microns in width, with 150 microns of space between the edge of each electrode. The sizing and arrangement of the electrodes is important itself, aside from the importance of the electrodes to conduct the electricity to the piezoelectric and magnetoelectric layers.

The power generated by the MEMFC is increased when the impedance of the system is lowered. Impedance is lowered when capacitance of the piezoelectric strands is increased. Capacitance can be increased by decreasing the distance "d" between the copper electrode pairs, increasing the width "w", and/or increasing the length "l." The relationship is shown in this equation for capacitance:

$$C = \frac{2\epsilon_r \epsilon_0 l}{\pi} \ln\left[\left(1 + \frac{w}{0.5\,d}1\right) + \sqrt{\left(1 + \frac{w}{0.5\,d}\right)^2 - 1}\right]$$

Changes to the dimensions of the electrodes affect the mechanical behavior of the resulting MEMFC, as well as the percentage of the MEMFC that is active. (The area beneath an electrode is inactive because the opposite polarity electrode is co-planar and the electric field lines spread laterally, therefore rendering that area directly below electrically inactive.)

The electrodes are kept separated, and then reinforced using a polyimide film support such as Kapton.

The solder alloy may be chosen from numerous potential options. Indalloy 1E is used in the preferred embodiment, although other solder alloys will work. Indalloy 1E has a composition of 52% Indium (In) and 48% Tin (Sn), with eutectic point of 118° C.

Additional alloys with a melting temperature near 120° C. include:

| Product name | Elemental composition (% by Mass): | Liquidus | Solidus |
| --- | --- | --- | --- |
| Indalloy #1 | 50.0 In, 50.0 Sn | 125° C., 257° F. | 118° C., 244° F. |
| Indalloy #1E | 52.0 In, 48.0 Sn | 118° C. E, 244° F. | 118° C., 244° F. |
| Indalloy #13 | 70.0 In, 15.0 Sn, | 125° C. MP, 257° F. | N/A, N/A |
| Indalloy #41 | 50.0 Bi, 28.0 Pb | 100° C. E, 212° F. | 100° C., 212° F. |
| Indalloy #43 | 40.5 Bi, 27.8 Pb | 102° C., 216° F. | 70° C., 158° F. |
| Indalloy #44 | 50.0 Bi, 25.0 Pb, | 115° C., 239° F. | 95° C., 203° F. |
| Indalloy #45 | 54.0 Bi, 26.0 Sn, | 103° C., 217° F. | 102° C., 216° F. |
| Indalloy #46 | 56.0 Bi, 22.0 Pb, | 104° C., 219° F. | 95° C., 203° F. |
| Indalloy #47 | 35.3 Bi, 35.1 Pb, | 105° C., 221° F. | 70° C., 158° F. |
| Indalloy #48 | 52.2 Bi, 37.8 Pb, | 105° C., 221° F. | 98° C., 208° F. |
| Indalloy #49 | 45.0 Bi, 35.0 Pb, | 107° C., 225° F. | 96° C., 205° F. |
| Indalloy #50 | 46.0 Bi, 34.0 Pb, | 108° C., 226° F. | 95° C., 203° F. |
| Indalloy #52 | 54.5 Bi, 39.5 Pb, | 108° C., 226° F. | 102° C., 216° F. |
| Indalloy #53 | 67.0 Bi, 33.0 In | 109° C. E, 228° F. | 109° C., 228° F. |
| Indalloy #54 | 51.6 Bi, 41.4 Pb, | 112° C., 234° F. | 98° C., 208° F. |
| Indalloy #55 | 40.0 Bi, 33.4 Pb, | 113° C., 235° F. | 72° C., 162° F. |
| Indalloy #56 | 54.4 Bi, 43.6 Pb, | 113° C., 235° F. | 104° C., 219° F. |
| Indalloy #57 | 50.0 Bi, 30.0 Pb, | 104° C., 219° F. | 95° C., 203° F. |
| Indalloy #58 | 53.0 Bi, 42.5 Pb, | 117° C., 243° F. | 103° C., 217° F. |
| Indalloy #59 | 38.2 Bi, 31.7 Sn, | 118° C., 244° F. | 75° C., 167° F. |
| Indalloy #61 | 53.7 Bi, 43.1 Pb, | 119° C., 246° F. | 108° C., 226° F. |
| Indalloy #62 | 55.0 Bi, 44.0 Pb, | 120° C., 248° F. | 117° C., 243° F. |
| Indalloy #63 | 56.8 Bi, 41.2 Pb, | 121° C., 250° F. | 92° C., 198° F. |
| Indalloy #64 | 55.0 Bi, 44.0 Pb, | 121° C., 250° F. | 120° C., 248° F. |
| Indalloy #65 | 46.0 Pb, 30.7 Bi, | 123° C., 253° F. | 70° C., 158° F. |
| Indalloy #67 | 58.0 Bi, 42.0 Pb | 126° C., 259° F. | 124° C., 255° F. |
| Indalloy #68 | 38.0 Pb, 37.0 Bi, | 127° C., 261° F. | 93° C., 199° F. |
| Indalloy #69 | 51.6 Bi, 37.4 Sn, | 129° C., 264° F. | 95° C., 203° F. |
| Indalloy #70 | 40.0 In, 40.0 Sn, | 130° C., 266° F. | 121° C., 250° F. |
| Indalloy #71 | 52.0 Sn, 48.0 In | 131° C., 268° F. | 118° C., 244° F. |
| Indalloy #72 | 34.0 Pb, 34.0 Sn, | 133° C., 271° F. | 96° C., 205° F. |
| Indalloy #73 | 56.8 Bi, 41.2 Sn, | 133° C., 271° F. | 128° C., 262° F. |
| Indalloy #74 | 38.4 Bi, 30.8 Pb, | 135° C., 275° F. | 96° C., 205° F. |
| Indalloy #75 | 57.4 Bi, 41.6 Sn, | 135° C. E, 275° F. | 135° C., 275° F. |
| Indalloy #76 | 36.0 Bi, 32.0 Pb, | 136° C., 277° F. | 95° C., 203° F. |
| Indalloy #78 | 36.7 Bi, 31.8 Pb, | 136° C., 277° F. | 95° C., 203° F. |
| Indalloy #79 | 55.1 Bi, 39.9 Sn, | 136° C., 277° F. | 121° C., 250° F. |
| Indalloy #80 | 36.4 Bi, 31.8 Pb, | 137° C., 279° F. | 95° C., 203° F. |
| Indalloy #81 | 43.0 Pb, 28.5 Bi, | 137° C., 279° F. | 96° C., 205° F. |
| Indalloy #83 | 38.4 Bi, 30.8 Bi, | 139° C., 282° F. | 96° C., 205° F. |
| Indalloy #84 | 45.0 Sn, 32.0 Pb, | 139° C., 282° F. | 132° C., 270° F. |
| Indalloy #224 | 52.2 In, 46.0 Sn, | 108° C. E, 226° F. | 108° C., 226° F. |
| Indalloy #253 | 74.0 In, 26.0 Cd | 123° C. E, 253° F. | 123° C., 253° F. |
| Indalloy #255 | 55.5 Bi, 44.5 Pb | 124° C. E, 255° F. | 124° C., 255° F. |
| Indalloy #281 | 58.0 Bi, 42.0 Sn | 138° C. E, 281° F. | 138° C., 281° F. |
| Indalloy #282 | 57.0 Bi, 42.0 Sn, | 140° C., 284° F. | 139° C., 282° F. |

With the component parts discussed, an explanation of the bonding process is helpful.

First, an explanation of TLP and LTTLP bonding.

TLP bonding is used to join two metal surfaces. A thin layer of metal is placed between the two metal surfaces, the thin layer containing a melting point depressant. During bonding the assembly is heated. The melting point depressant then melts and fills the voids of the two metal surfaces in contact. The depressant metal then interdiffuses with the two metal surfaces, shifting the mixture away from the eutectic point, at which point the interdiffused metals undergoes isothermal solidification—solidifying without a decrease in temperature.

"Eutectic" denotes a mixture of substances that melts and solidifies at a single temperature, the single temperature lower than the melting points of the separate constituents.

The resulting bond is homogeneous. It may then be cooled, and on any subsequent reheating remains solid above the original melt process temperature.

While the bonding process may sound similar to brazing, brazing requires the temperature to be lowered to solidify the filler metal.

A variant of TLP bonding that employs a low temperature melting solder is low temperature transient liquid phase bonding ("LTTLP").

In LTTLP bonding the base materials need not be metal, but can be other materials, such as ceramics. Prior to the bonding process the bonding surfaces are coated with one or more layers of base metal, followed by a layer of low melting point solder.

The bond is then heated. At the solder melting point, a portion of the base metal dissolves in the solder and undergoes isothermal solidification. The resulting metal alloy created from the mixture of solder and base has a higher eutectic point than the solder melting point. Thus, as with TLP, the bond can withstand temperatures above the bonding temperature.

The resulting composite material outperforms others fabricated using traditional bonding due to the superior mechanical coupling and the conductive bonding layer. The conductive bonding layer results in electrical continuity between the PE and ME layers.

This type of bonding is novel in the industry.

Historically ME composites have not been bonded using transient liquid phase ("TLP") bonding. There are multiple reasons for this.

First, ME composites may be manufactured by bonding a magnetostrictive material to a piezoelectric and plastic composite. TLP bonding cannot be used to bond such materials because: (1) the plastic present in the piezoelectric provides poor adhesion to metal, and (2) ceramics are not metals, and thus cannot be bonded using TLP bonding. TLP can only bond two metal surfaces because the two surfaces must be able to dissolve or form a eutectic with each other, or with a third metal placed between them.

Second, any method of bonding PE and MS materials must take place at temperatures below the Curie temperature of the constituent materials. The "Curie temperature" is the temperature at which materials lose their permanent magnetic properties. Given that the magnetic properties of the PE material and MS material are critical to operation, exceeding the Curie temperature during bonding results in a useless MEMFC.

Most metal bonding techniques require temperatures above the Curie temperature, making such techniques inappropriate for MEMFC fabrication.

Third, having limited the pool of potential bonding techniques to those that can bond non-metallic surfaces, and do so at temperatures below the Curie temperature, there are limited options for bonding.

Even if a set of constituent metals can be located that allow for a bonding temperature below the Curie temperature, not all metals may be used. Many metals can degrade the properties of the MS and PE materials. This restriction further limits the choice of base metal and solder metals to those that will not negatively affect the MS/PE materials.

Disclosed within is the use of titanium as an adhesion layer, and gold as a bonding layer. In order to create a bond, layer of titanium is first applied to both the PE and MS materials. The oxygen present in the PE material bonds to the titanium, forming a Ti—O bond. The titanium prepares the surface of the PE/MS materials for a layer of gold that is applied over the layer of titanium. Given that gold is a noble metal is does not readily adhere, but the titanium addresses this issue. The titanium further acts as a barrier and prevents the gold from diffusing into the PE/MS materials during the LTTLP bonding.

Alternative materials for creation of an adhesion layer include chromium, titanium nitride, palladium, and other similar metals.

Returning to LTTLP bonding, this method of bonding provides an additional advantage. An MFC can operate in either d33 (co-planar electrode) or d31 (opposing electrode) modes. Bonding the PE and MS layers using an electrically conductive means—LTTLP bonding—provides the additional benefit of reducing the number of required electrodes (especially in d31 mode). Known methods of bonding require the placement of a polymer layer between the PE and MS layers. As a result, electrodes are needed both above and below the resulting composite because the PE and MS layers are electrically isolated. But by manufacturing the MEMFC using the disclosed process, the PE and MS layers are in electrical communication across the LTTLP bond line. Thus, electrodes may be applied to either the PE or MS layers, without need to apply electrodes to both layers.

Given this background on the included materials, the following is the method of fabrication divided into steps.

1. Prepare piezoelectric material;
    a. Optional step of removing nickel coating, if the sourced material includes a nickel coating.
    b. Cutting the PE material into 21 mm squares.
2. Prepare the magnetostrictive material;
    a. If ferrite tape is used, optional step of firing the ferrite tape. Firing the tape burns away the plastic layer and densifies the ferrite.
3. Coat one side of the PE material with a 1000 Å thick layer of titanium (Ti). The resulting layer is referred to as the PE adhesion layer;
4. Coat one side of the MS material with a 1000 Å thick layer of titanium (Ti). The resulting layer is referred to as the MS adhesion layer;
5. Coat one side of the PE material with a 1000 Å thick layer of gold (Au). The resulting layer is referred to as the PE bonding layer;
6. Coat one side of the MS material with a 1000 Å thick layer of gold (Au). The resulting layer is referred to as the MS bonding layer;
7. Deposit a 10 µm thick layer of solder alloy on the coated PE side;
    a. Preferred method uses a high throughput ultrasonic jet vapor deposition process.
8. Deposit a 10 µm thick layer of solder alloy on the coated MS side;
    a. Preferred method uses a high throughput ultrasonic jet vapor deposition process.
9. Press the PE bonding layer and MS bonding layer against one-another 100 gm weight, at 125 deg C., for one hour, in an atmosphere of $H_2$ and $N_2$;
    a. Performing the bonding in an atmosphere of hydrogen and nitrogen prevents oxygen or water from being incorporated into the bond.
    b. Oxygen and water are each detrimental to the bond strength.
10. Optionally perform testing of the resulting ME composite;
    (1) Coat the ME composite with room temperature silver paste on the piezoelectric side.
    (2) Perform testing.
    (3) Remove the silver paste.
    (4) Deposit platinum using a shadow mask.
    (5) Perform testing.
    (6) Remove platinum.
    b) Slice the ME into 150 µm wide fibers;
    c) Apply the flexible circuit with an electrode direction perpendicular to the fibers;
    d) Spin coat the assembly with epoxy; and
    e) Vacuum bond the assembly for twelve hours at room temperature.

Discussed next is a particular embodiment of the disclosed device.

BRIEF DESCRIPTION OF THE DRAWINGS

The invention can be best understood by those having ordinary skill in the art by reference to the following detailed description when considered in conjunction with the accompanying drawings in which.

DETAILED DESCRIPTION

Figure 1:
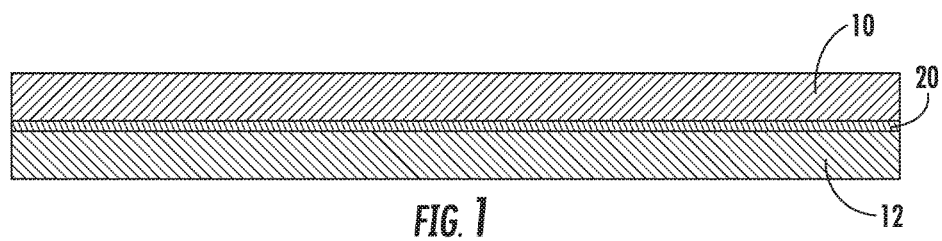
FIG. 1 illustrates a first embodiment with the PE and MS layers separated by the solder alloy layer.

Reference will now be made in detail to the presently preferred embodiments of the invention, examples of which are illustrated in the accompanying drawings. Throughout the following detailed description, the same reference numerals refer to the same elements in all figures.

Referring to FIG. 1, a first embodiment with the PE and MS layers separated by the solder alloy layer is shown.

Piezoelectric layer 10 is shown atop the magnetostrictive layer 12, separated by the solder alloy 20. Not shown are the adhesion and bonding layers present on the facing surfaces of the piezoelectric layer 10 and magnetostrictive layer 12.

Figure 8:
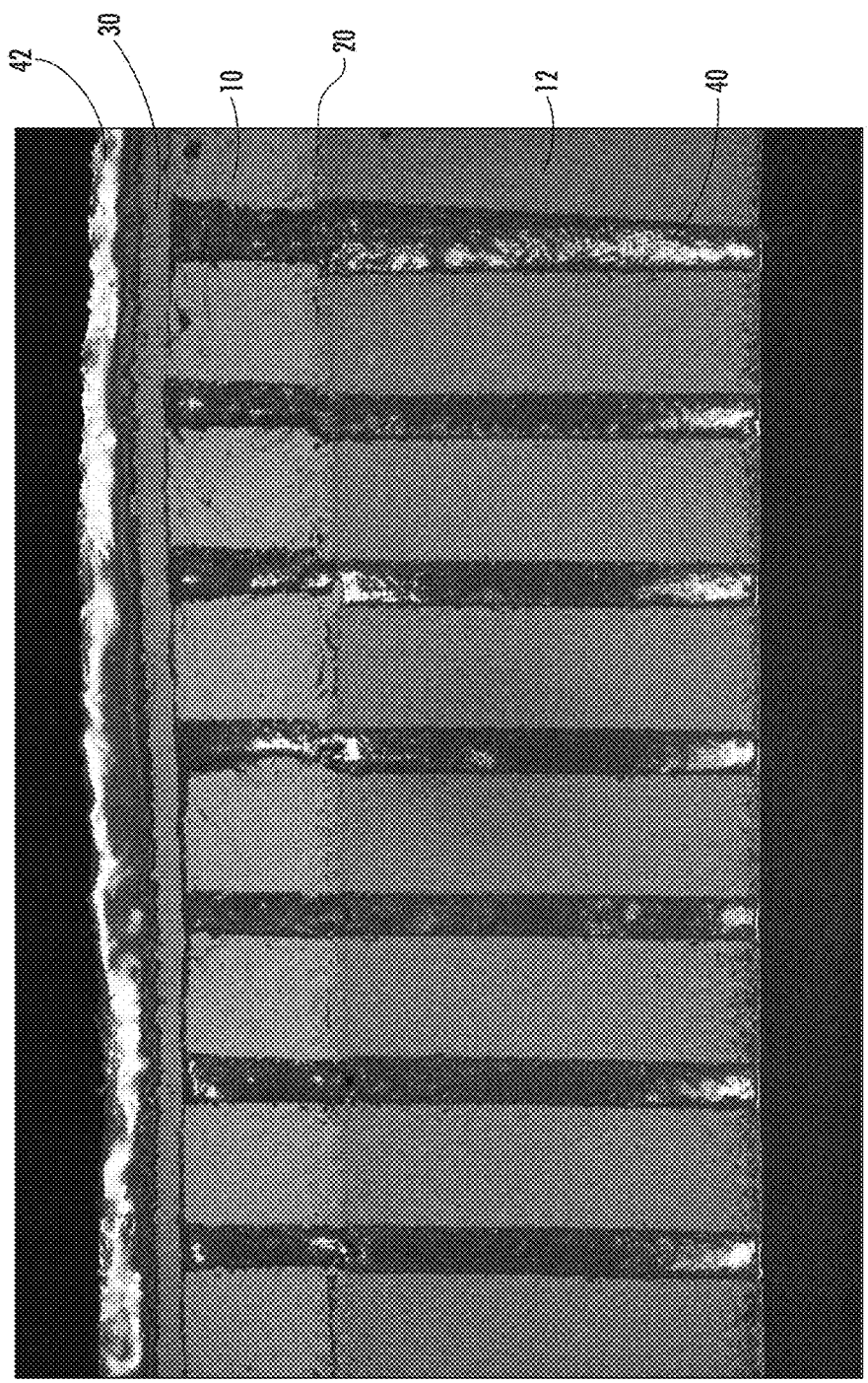
FIG. 8 is a photograph of an embodiment produced according to the disclosed method.

The solder alloy 20 separates the piezoelectric layer 10 and magnetostrictive layer 12. This is a simplification for the purposes of illustration. Once the LTTLP bonding occurs the solder alloy 20 becomes an indistinct layer more properly referred to as a bond line, as is shown in FIG. 8. But for the purposes of discussion the solder alloy 20, or bond line, will be shown as a distinct layer.

Figure 2:
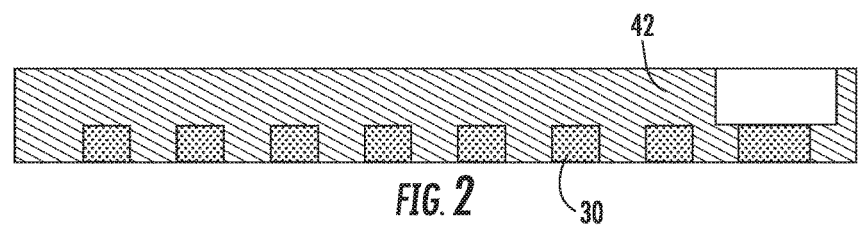
FIG. 2 illustrates a first embodiment of the electrode layer including the polyimide film.

Referring to FIG. 2, a first embodiment of the electrode layer including the polyimide film is shown. Electrode film layer 30 is shown, which consists of first interdigitated electrode film pattern 32 and second interdigitated electrode film pattern 34, which are not shown.

Polyimide film 42 is shown reinforcing and separating the electrodes of the electrode film layer 30.

Figure 3:
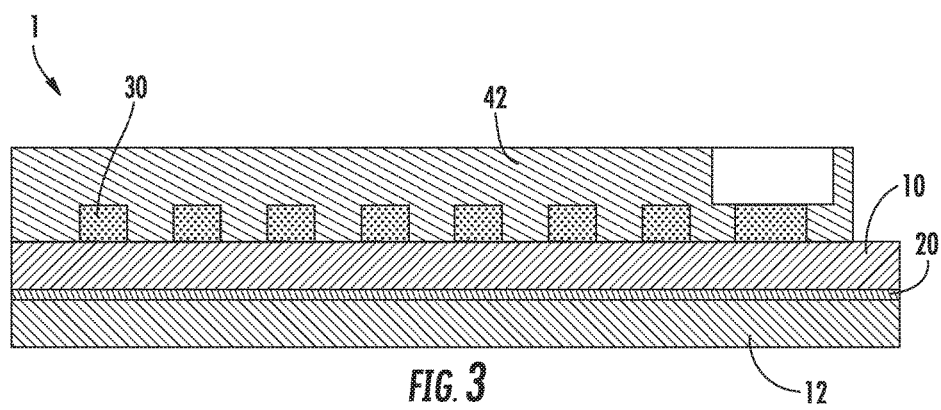
FIG. 3 illustrates a MEMFC with the electrode layer bonded to the PE and MS layers.

Referring to FIG. 3, a MEMFC with the electrode layer bonded to the PE and MS layers is shown.

The electrode film layer 30 is in electrical contact with the piezoelectric layer 10 and magnetostrictive layer 12 through the solder alloy 20, which after bonding becomes the bond line.

The polyimide film 42 again separates the electrodes 30.

Figure 4:
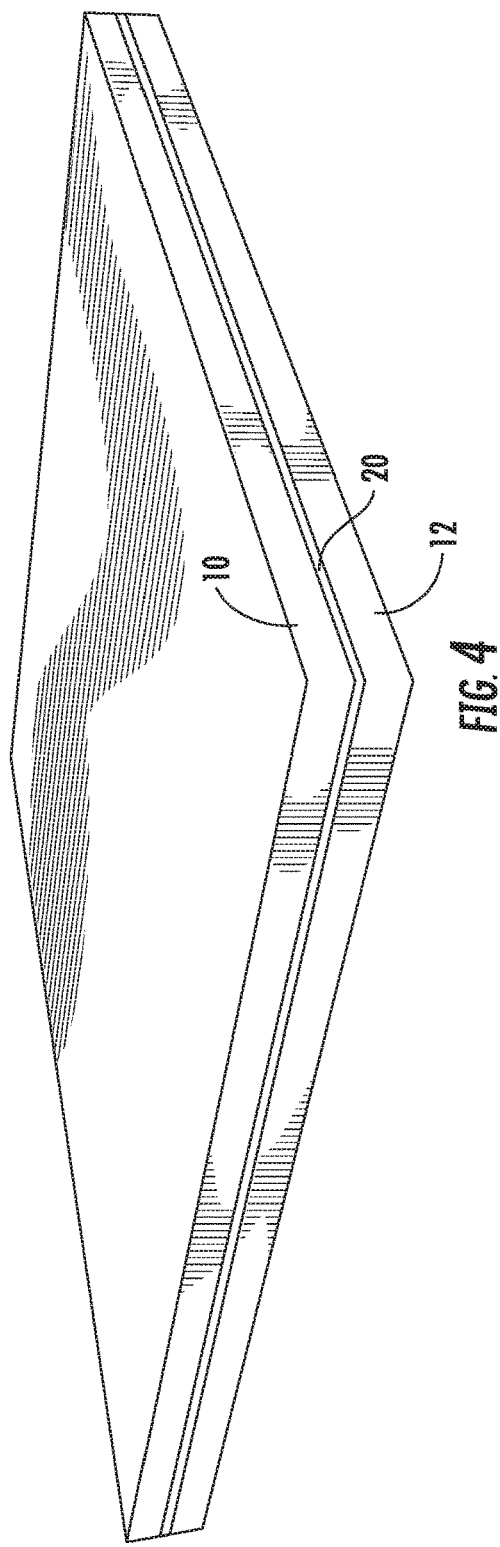
FIG. 4 illustrates an isometric view of the PE and MS layers separated by the solder alloy layer.

Referring to FIG. 4, an isometric view of the PE and MS layers separated by the solder alloy layer is shown.

Again shown is the piezoelectric layer 10 and magnetostrictive layer 12 separated by the solder alloy 20. But in FIG. 4 the layers 10/12 are shown prior to the step of cutting to create fibers/strands.

Figure 5:
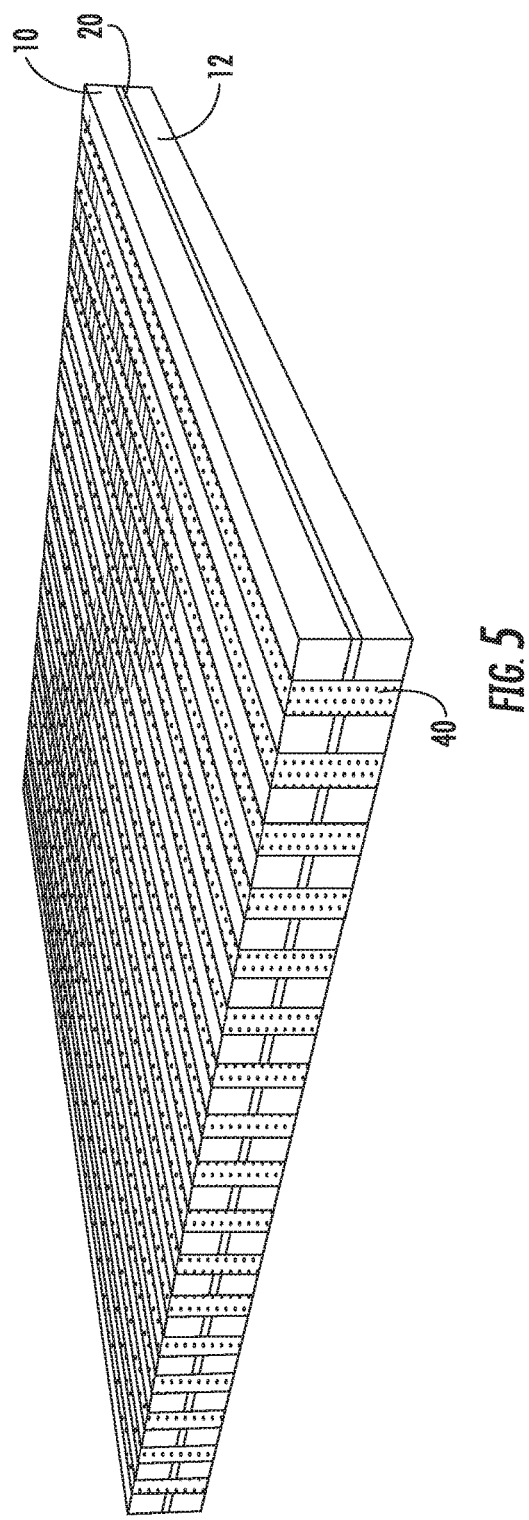
FIG. 5 illustrates an isometric view of the PE and MS layers after slicing and filling with epoxy.

Referring to FIG. 5, an isometric view is shown of the PE and ME layers after slicing to create fibers/strands and when filled with epoxy. Epoxy 40 fills the spaces between each fiber/strand of the MEMFC, each fiber composed of a piezoelectric layer 10 and magnetostrictive layer 12 joined by a solder alloy 20, forming a bond line.

While not shown in the figure, during fabrication the MEMFC is stabilized using an underlayer of dicing tape. The dicing tape holds the divided fibers/strands of the composite material in position relative to one-another after slicing, and before the spaces are filled with epoxy 40.

Figure 6:
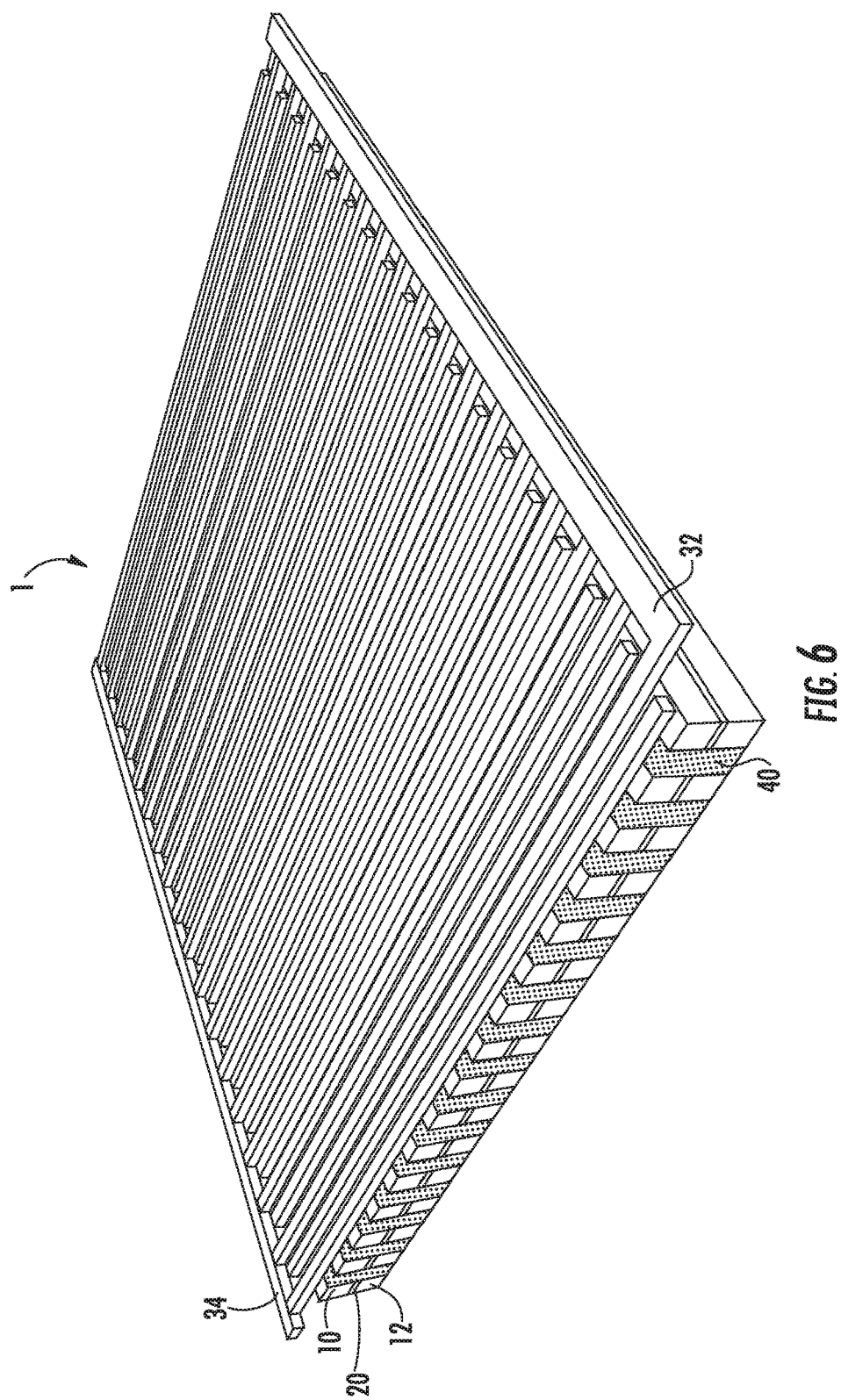
FIG. 6 illustrated the PE and MS layers with the electrode layer bonded to the top.

Referring to FIG. 6, the PE and MS layers with the electrode layer bonded to the top is shown.

The fibers formed by the piezoelectric layer 10 and magnetostrictive layer 12 are topped with the electrode film layer 30, shown divided into the two electrodes, the first interdigitated electrode film pattern 32 and the second interdigitated electrode film pattern 34. The patterns 32/34 connect electrically through the piezoelectric layer 10 and magnetostrictive layer 12. Thus, deformation of the piezoelectric layer 10 and magnetostrictive layer 12 creates a voltage across the electrode patterns 32/34, or application of a voltage across the electrode patterns 32/34 results in deformation.

The electrode layer is bonded to the ME composite using epoxy.

Figure 7:
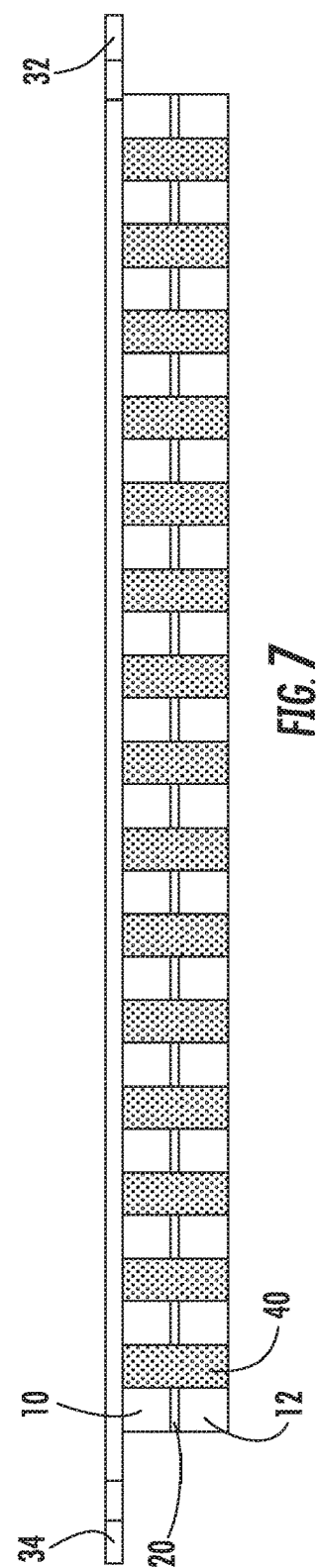
FIG. 7 illustrates a side view of the completed MEMFC.

Referring to FIG. 7, a side view of the completed MEMFC is shown.

Shown is a slice of the MEMFC illustrating the continuity across a single electrode connecting multiple fibers.

Referring to FIG. 8, a photograph of an embodiment produced according to the disclosed method is shown.

Starting at the top of the figure, polyimide film 42 is shown, with electrode film layer 30 beneath. This is followed by the piezoelectric layer 10 and magnetostrictive layer 12. The solder alloy 20 has dispersed within the adhesion and bonding layers of the piezoelectric layer 10 and magnetostrictive layer 12, thus making the bond indistinct.

The sliced fibers are separated by epoxy 40.

Equivalent elements can be substituted for the ones set forth above such that they perform in substantially the same manner in substantially the same way for achieving substantially the same result.

It is believed that the system and method as described and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely exemplary and explanatory embodiment thereof. It is the intention of the following claims to encompass and include such changes.

What is claimed is:

1. A magnetoelectric composite material comprised of:
a layer of piezoelectric (PE) material;
a layer of magnetostrictive (MS) material;
the layer of piezoelectric material bonded to the layer of magnetostrictive material using low temperature transient liquid phase (LTTLP) bonding, forming a composite material;
the LTTLP bond comprised of:
titanium, gold, and a solder alloy;
the titanium used to form an adhesion layer on the PE material and the MS material;
the gold used to form a bonding layer on the PE material and the MS material; and
the solder alloy used to bond the PE material and MS material together by diffusing into the bonding layers;
the composite material divided into multiple fibers:
a flexible circuit;
the flexible circuit applied to the composite material;
an epoxy spin coating applied to the combination of the flexible circuit and composite material;

wherein the solder alloy has a melting point at or below a Curie temperature of the PE material and at or below a Curie temperature of the MS material.

2. The composite material of claim 1, further comprising:
an interdigitated electrode having a first electrode pattern and a second electrode pattern, the interdigitated electrode bonded to either the PE material or the MS material;
whereby deformation of the composite material causes a voltage difference between the first electrode pattern and the second electrode pattern.

3. The composite material of claim 1, wherein the solder alloy the solder alloy is 52% Indium (In) and 48% Tin (Sn), with a eutectic point of 118° C.

4. A method of fabricating a composite material with piezoelectric (PE) and magnetostrictive (MS) layers, the method comprising:
creating a PE adhesion layer by coating one side of a piezoelectric material with a layer of a first metal;
creating an MS adhesion layer by coating one side of a magnetostrictive material with a layer of the first metal;
creating a PE bonding layer by coating the PE adhesion layer with a layer of a second metal;
creating a MS bonding layer by coating the MS adhesion layer with a layer of the second metal;
creating an PE solder layer by depositing solder alloy on the PE bonding layer;
creating a MS solder layer by depositing solder alloy on the MS bonding layer;
pressing the PE solder layer and MS solder layer against one-another while heating to a temperature;
the temperature no greater than a Curie temperature of the magnetostrictive material;
thereby bonding the PE and MS materials to each other, resulting in the composite materials;
slicing the composite material into fibers;
applying a flexible circuit to the composite material;
spin coating the composite material and flexible circuit with epoxy; and
vacuum bonding the composite material and flexible circuit.

5. The method of claim 4, further comprising the step of:
bonding an interdigitated electrode on the piezoelectric material, the interdigitated electrode having a first electrode pattern and a second electrode pattern.

6. The method of claim 4, wherein:
the first metal is titanium; and
the second metal is gold.

7. The method of claim 4, wherein:
the solder alloy is composed of 52% Indium (In) and 48% Tin (Sn), with eutectic point of 118° C.

8. A composite material fabricated by the process of:
coating a piezoelectric (PE) material with one or more layers of metal;
coating a magnetostrictive (MS) material with one more layers of metal;
creating a first solder layer by depositing solder alloy on the one or more layers of metal of the PE material;
creating a second solder layer by depositing solder alloy on the one or more layers of metal of the MS material;
pressing the first solder layer and second solder layer together while applying heat, thereby bonding the PE and ME materials to each other, resulting in a magnetoelectric composite materials;
slicing the magnetoelectric composite material into fibers;
applying a flexible circuit to the magnetoelectric composite material;
spin coating the magnetoelectric composite fibers and flexible circuit with epoxy; and
vacuum bonding the magnetoelectric composite material and flexible circuit;
thereby creating an MEMFC.

9. The composite material fabricated by the process of claim 8, wherein:
the one or more layers of metal applied to the PE material is titanium.

10. The composite material fabricated by the process of claim 8, wherein:
the one or more layers of metal applied to the PE material is a layer of titanium followed by a layer of gold.

11. The composite material fabricated by the process of claim 8, wherein:
the solder alloy has a melting point at or below a Curie temperature of the PE material and at or below a Curie temperature of the MS material.

12. The composite material fabricated by the process of claim 8, further comprising the step of:
bonding an interdigitated electrode on the piezoelectric material, the interdigitated electrode having a first electrode pattern and a second electrode pattern.

* * * * *